(12) United States Patent
Yano et al.

(10) Patent No.: US 9,357,593 B2
(45) Date of Patent: May 31, 2016

(54) LIGHT-EMITTING DEVICE

(75) Inventors: Takakazu Yano, Toshima-ku (JP); Kota Ishii, Fujiyoshida (JP); Akio Yoshimura, Fujiyoshida (JP); Sadato Imai, Minamitsuru-gun (JP)

(73) Assignees: CITIZEN ELECTRONICS CO., LTD., Yamanashi-ken (JP); CITIZEN HOLDINGS CO., LTD., Tokyo (JP)

( * ) Notice: Subject to any disclaimer, the term of this patent is extended or adjusted under 35 U.S.C. 154(b) by 361 days.

(21) Appl. No.: 13/286,401

(22) Filed: Nov. 1, 2011

(65) Prior Publication Data

US 2012/0104957 A1    May 3, 2012

(30) Foreign Application Priority Data

Nov. 1, 2010 (JP) ................. 2010-245264

(51) Int. Cl.
*H05B 37/00* (2006.01)
*H05B 33/08* (2006.01)
*H01L 25/075* (2006.01)
*H01L 33/50* (2010.01)

(52) U.S. Cl.
CPC ........ *H05B 33/0809* (2013.01); *H05B 33/0857* (2013.01); *H01L 25/0753* (2013.01); *H01L 33/50* (2013.01); *H01L 2924/0002* (2013.01)

(58) Field of Classification Search
CPC ........... H01L 2223/00; H01L 2223/58; H01L 33/0045
USPC ...................................................... 315/320
See application file for complete search history.

(56) References Cited

U.S. PATENT DOCUMENTS

| | | | | |
|---|---|---|---|---|
| 5,844,377 A * | 12/1998 | Anderson et al. | ............. | 315/251 |
| 6,521,915 B2 * | 2/2003 | Odaki | ................ | C09K 11/7731 257/100 |
| 6,791,116 B2 * | 9/2004 | Hirano | ................ | H01L 33/508 257/100 |
| 6,850,002 B2 * | 2/2005 | Rossner | ............... | C09K 11/773 252/301.6 S |
| 7,023,019 B2 * | 4/2006 | Maeda et al. | ................... | 257/89 |
| 7,026,756 B2 * | 4/2006 | Shimizu | ............. | C09K 11/7767 257/98 |
| 7,132,785 B2 * | 11/2006 | Ducharme | .................... | 313/501 |
| 7,229,571 B2 * | 6/2007 | Ezuhara | ............. | C09K 11/7734 252/301.4 F |
| 7,294,956 B2 * | 11/2007 | Maeda et al. | .................. | 313/486 |
| 7,422,504 B2 * | 9/2008 | Maeda et al. | ................... | 445/24 |
| 7,479,662 B2 * | 1/2009 | Soules | ................. | H01L 33/507 257/100 |
| 7,488,432 B2 * | 2/2009 | Murazaki | ........... | C09K 11/0883 252/301.4 F |
| 7,592,633 B2 * | 9/2009 | Shakuda | ............... | H01L 27/156 257/100 |

(Continued)

FOREIGN PATENT DOCUMENTS

JP    2010-103522 A    5/2010

OTHER PUBLICATIONS

Chinese Notice of the First Office Action of Chinese Application No. 201110425451.6 dated Feb. 28, 2015.

*Primary Examiner* — Minh D A
(74) *Attorney, Agent, or Firm* — Browdy and Neimark, PLLC (57) ABSTRACT

A light-emitting device includes a substrate including electrodes, a first group including a plurality of blue light-emitting diode elements that are disposed on the substrate and electrically connected to the electrodes, a second group including a plurality of blue light-emitting diode elements that are disposed on the substrate and electrically connected to the electrodes, a fluorescent layer disposed to receive light from the first group of blue light-emitting diode elements, and a phosphorescent layer disposed to receive light from the second group of blue light-emitting diode elements.

18 Claims, 10 Drawing Sheets

(56) References Cited

U.S. PATENT DOCUMENTS

| | | | |
|---|---|---|---|
| 7,592,639 B2* | 9/2009 | Maeda et al. | 257/98 |
| 7,656,307 B2* | 2/2010 | Yatsuda | F21K 9/00 |
| | | | 340/584 |
| 7,691,650 B2* | 4/2010 | Yoo | H01L 33/44 |
| | | | 257/E51.018 |
| 7,755,282 B2* | 7/2010 | Sun | H05B 33/10 |
| | | | 313/498 |
| 7,784,956 B2* | 8/2010 | Cohen | 362/84 |
| 2006/0261361 A1* | 11/2006 | Shakuda | H01L 27/156 |
| | | | 257/98 |
| 2007/0278502 A1* | 12/2007 | Shakuda | C09K 11/584 |
| | | | 257/88 |
| 2008/0135862 A1* | 6/2008 | Maeda | C09K 11/025 |
| | | | 257/98 |
| 2008/0169752 A1* | 7/2008 | Hattori et al. | 313/503 |
| 2010/0231135 A1* | 9/2010 | Hum | H05B 33/083 |
| | | | 315/250 |

* cited by examiner

LIGHT-EMITTING DEVICE

CROSS-REFERENCE TO RELATED APPLICATION

This application is based on and claims the priority benefit of Japanese Patent Application No. 2010-245264, filed on Nov. 1, 2010, the disclosure of which is incorporated herein by reference in its entirety.

BACKGROUND OF THE INVENTION

1. Field of the Invention

The present invention relates to a light-emitting device including semiconductor light-emitting elements such as light-emitting diode elements (hereinafter referred to as LED elements) or the like, more specifically, to a light-emitting device in which a semiconductor light-emitting element is driven alternately.

2. Description of the Related Art

In recent years, an LED element has widely been used for a backlight of a color display, illumination or the like, because the LED element is a semi-conductor light-emitting element, it has a long service life and is miniaturized, has excellent driving characteristic and high light-emitting efficiency, and is capable of emitting bright emission color.

In particular, recently, there is widely adopted an AC drive type-light-emitting device in which an alternating-current power source (hereinafter referred to as AC power source) is used for color light emission by a combination of LED elements and a fluorescent resin, the number of the LED elements connected in series is changed depending on a voltage level (or current level) of the AC power source, temporally changed, that is, the voltage level of the AC power source is switched, and the LED elements are lighted.

However, because the voltage level of the AC power source in the AC drive light-emitting device changes depending on a time, LED elements having a threshold are not lighted while the AC power source is in a low voltage level, and the light emitting of the LED elements are initiated after a voltage level of the AC power source reaches a predetermined level. Consequently, a phenomenon in which the light emission of the LED elements is not performed occurs in a switching area of the AC power source. This results in flicker of light in the light-emitting device.

As method resolving the flicker, there has been proposed a structure in which a phosphorescent material is added to a fluorescent resin covering the LED elements, the flicker is prevented from occurring by covering a non-light-emitting portion of the LED elements by use of afterglow of phosphorescence excited by the light emitting of the LED elements (for example, see Japanese Patent Application Publication No. 2010-103522).

A conventional light-emitting device as disclosed in Japanese Patent Application Publication No. 2010-103522 is described hereinafter with reference to FIGS. 9 and 10.

Figure 9:
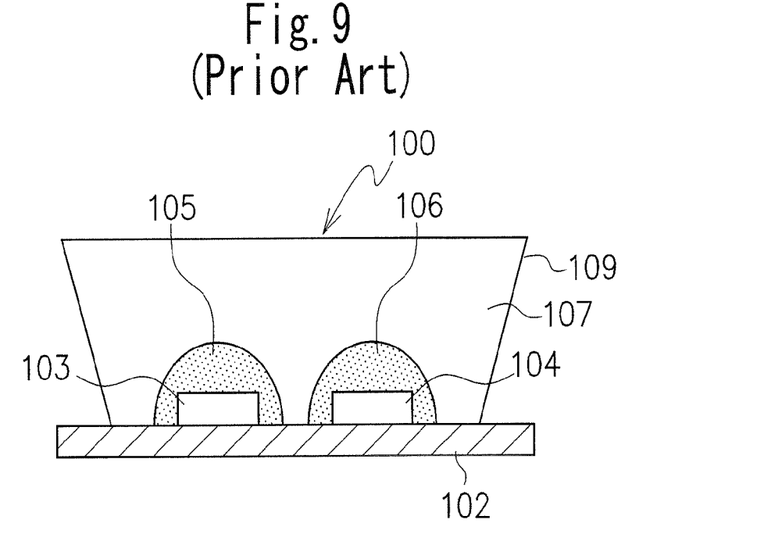
FIG. 9 is a sectional view showing a conventional light-emitting device.

In FIG. 9, the light-emitting device 100 includes a substrate 102, a first LED element group 103 and a second LED element group 104 which are mounted on the substrate 102, a first delay phosphor 105 covering the first LED element group 103, and a second delay phosphor 106 covering the second LED element group 104. Here, the delay phosphor is considered as a mixture of a fluorescent material and a phosphorescent material. The light-emitting device 100 further includes a reflection cup 109 in which a transparent resin 107 for protection is molded.

Figure 10:
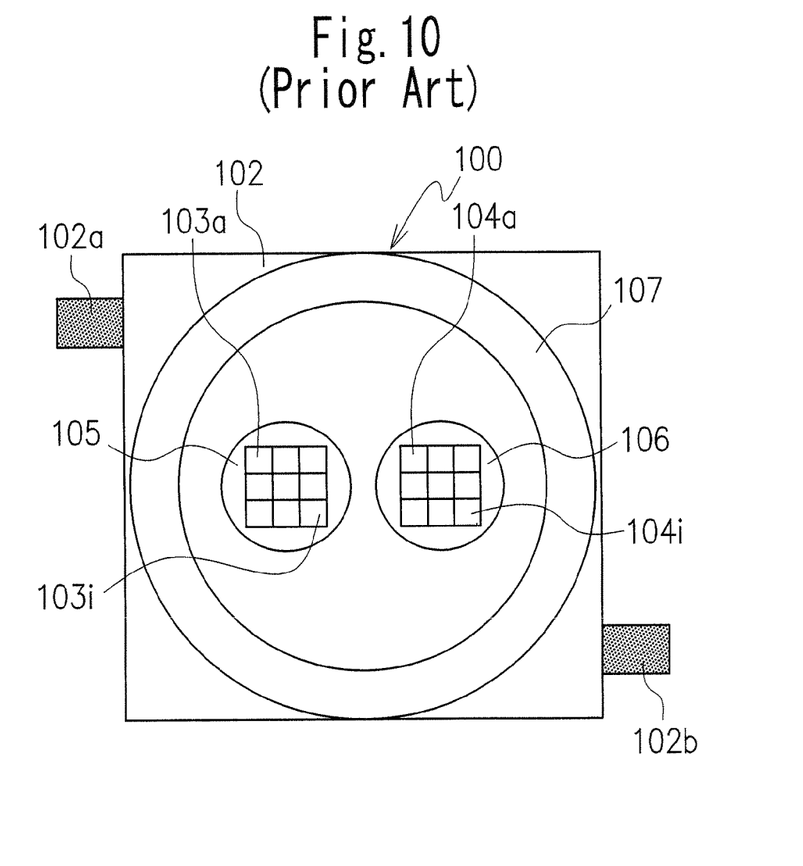
FIG. 10 is a plan view of the light-emitting device as shown in FIG. 9.

As shown in FIG. 10, the first LED element group 103 is formed by a plurality of LED elements 103a to 103i, and the second LED element group 104 is formed by a plurality of LED elements 104a to 104i. The plurality of LED elements 103a to 103i are connected in series, and the plurality of LED elements 104a to 104i are connected in series. The plurality of LED elements 103a to 103i and the plurality of LED elements 104a to 104i are connected to electrodes 102a and 102b which are provided on the substrate 102 and are electrically connected to an AC power source, thereby the plurality of LED elements 103a to 103i and the plurality of LED elements 104a to 104i are lighted.

It is possible to form a variety of light-emitting colors by selecting a kind of the first LED element group 103 and the second LED element group 104, and kinds of the first delay phosphor 105 and the second delay phosphor 106, and prevent flicker of light emitted from LED elements from occurring, which is one problem of an AC drive by afterglow of the first delay phosphor 105 and the second delay phosphor 106.

In the light-emitting device disclosed in Japanese Patent Application Publication No. 2010-103522, a plurality of semi-conductor light-emitting elements mounted on the substrate are divided into at least two groups and driven by an AC power source. In the light-emitting device, afterglow is formed by covering the first LED element group 103 and the second LED element group 104 by the first delay phosphor 105 and the second delay phosphor 106, respectively, and it is possible to prevent the flicker of LED elements caused by the AC drive from occurring.

However, in Japanese Patent Application Publication No. 2010-103522, preventing the flicker from occurring and diversity of light-emitting colors are disclosed, but there is no disclosure about a consideration relating to chromaticity adjustment based on an arrangement, drive method and so on of a phosphor and a phosphorescent body emitting light even after light receiving is stopped.

SUMMARY OF THE INVENTION

An object of the present invention has been proposed in view of the above problems.

A light-emitting device according to an embodiment of the present invention includes a substrate provided with electrodes, a first group including a plurality of blue LED elements that are electrically connected to the electrodes, a second group including a plurality of blue LED elements that are electrically connected to the electrodes, a fluorescent layer disposed to receive light from the first group of blue LED elements and a phosphorescent layer disposed to receive light from the second group of blue LED elements.

In another embodiment, a third group of blue LED elements may be provided. A fluorescent layer should be disposed to receive light from the first group of blue LED elements that are configured to light us first of all of the groups of blue LED elements, and a phosphorescent layer should be disposed to receive light from at least one of the second group, and/or the third group or more groups.

DETAILED DESCRIPTION OF THE PREFERRED EMBODIMENTS

Preferred embodiments of the present invention will be explained hereinafter in detail with reference to the accompanying drawings.

<First Embodiment>

Figure 1:
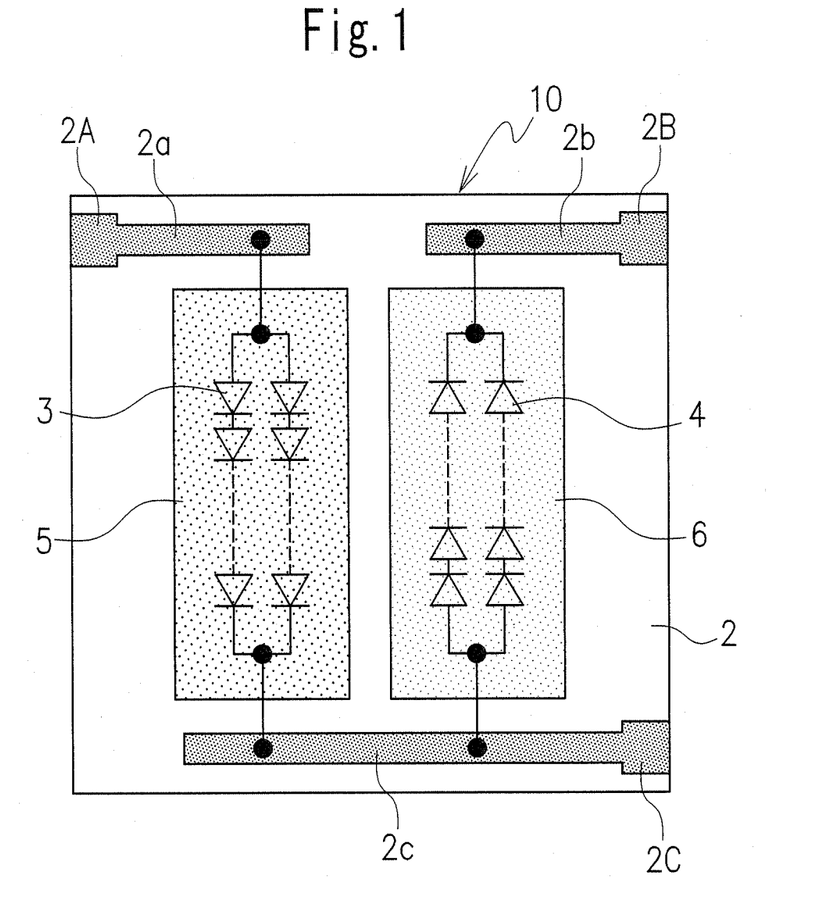
FIG. 1 is a plan view showing a light-emitting device according to a first embodiment of the present invention.
Figure 2:
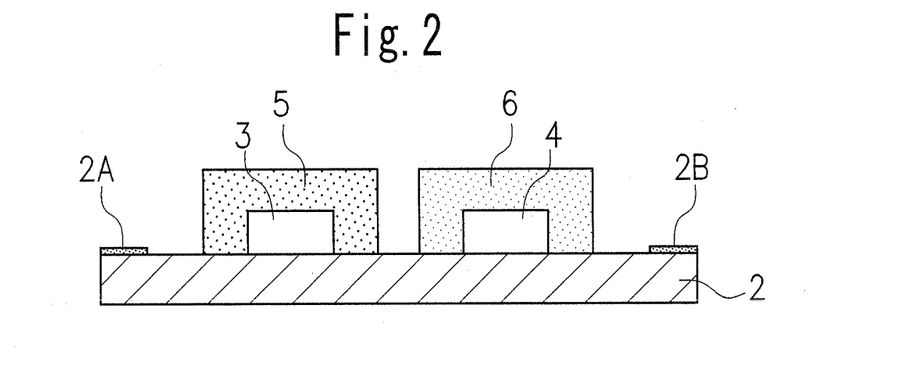
FIG. 2 is a sectional view of a main part of the light-emitting device as shown in FIG. 1.

FIGS. 1 and 2 illustrate a structure of a first embodiment of a light-emitting device according to the present invention. As shown in FIGS. 1 and 2, the light-emitting device 10 includes a substrate 2 provided with electrodes 2A, 2B, and 2C, a first group 3 including a plurality of blue light-emitting diode elements (hereinafter referred to as first group of blue LED elements) that are electrically connected to the electrodes 2A and 2C of the substrate 2, and a second group 4 including a plurality of blue light-emitting diode elements (hereinafter referred to as second group of blue LED elements) that are electrically connected to the electrodes 2B and 2C of the substrate 2. Of course, in addition to the first group 3 and the second group 4 of blue LED elements, a third group of blue LED elements or more groups of blue LED elements may be provided. Even in such cases, a fluorescent layer should be disposed to receive light from the first group of blue light-emitting diode elements that are configured to light us up first of all of the groups, and a phosphorescent layer should be disposed to receive light from at least one of the second group, the third group or more groups, due to characteristics of fluorescent material, phosphorescent material, and AC voltage supply as explained below. Of course, if a third group or more groups of blue LED elements are provided, more electrodes than those shown in FIGS. 1 and 2 will be provided on the substrate to apply voltage to the blue LED elements of all groups. In the first embodiment, for example, the first group 3 of blue LED elements and the second group 4 of blue LED elements are disposed side by side on the surface of the substrate 2. The blue LED elements may be disposed on a metal plate to release heat generated in the LED elements, or the first group of blue LED elements may be disposed on a substrate and the second group of blue LED elements may be disposed on another substrate.

A fluorescent layer 5 is disposed to receive light from the first group 3 of blue LED elements, and a phosphorescent layer 6 is disposed to receive light from the second group 4 of blue LED elements. In the first embodiment, the first group 3 of blue LED elements may be directly covered by a fluorescent layer 5, and the second group 4 of blue LED elements may be directly covered by a phosphorescent layer 6 (see FIG. 2). Also, the fluorescent layer 5 may be disposed above the first group 3 of blue LED elements and the phosphorescent layer 6 may be disposed above the second group 4 of blue LED elements.

As one example, the fluorescent layer 5 is made of a material including YAG material that emits yellow light, and the phosphorescent layer 6 is made of a material including phosphorescence that emits green light. The phosphorescent layer may be formed by a layer including a first phosphorescence that emits green light and a second phosphorescence that emits red light.

The fluorescent layer 5 may be made of a nitride material that is oxide to emit red light and the phosphorescent layer includes phosphorescence that emits green light.

The number of blue LED elements disposed in each of the first, second or more groups is not limited to what are shown in embodiments and Figures. Here, it also should be noted that "blue light-emitting diodes" may include light-emitting diodes that emit light including a range from blue to green in spectrum. In the first embodiment, the first group 3 of blue LED elements and the second group 4 of blue LED elements are disposed, for example, side by side on the surface of the substrate 2. The electrodes provided on the substrate may be a first electrode 2A, a second electrode 2C, and a third electrode 2B. The plurality of blue LED elements of the first group 3 may be electrically connected to the first electrode 2A and the second electrode 2C, the plurality of blue LED elements of the second group 4 electrically connected to the second electrode 2C and the third electrode 2B. The first electrode 2A is electrically in contact with a first electrode pattern 2a, and the third electrode 2B is electrically in contact with a third electrode pattern 2b, and the first electrode pattern 2a and the third electrode pattern 2b are separately extended along one side of the substrate 2. The second electrode 2C is electrically in contact with a second electrode pattern 2c that is extended along another side that is opposite to the one side of the substrate. The first electrode 2A, the second electrode 2C, and the third electrode 2B may be positioned adjacent to respective corners of the substrate. The electrode patterns are not limited to the mentioned above, and when more groups of blue LED elements are provided, more electrode patterns may be provided or/and shapes of the electrode patterns may be changed.

The first group of blue LED elements 3 and the second group of blue LED elements 4 are electrically connected in series through electrode patterns 2a, 2b and 2c to the first electrode 2A, the second electrode 2C, and the third electrode 2B provided on the substrate 2.

A control circuit 50 controls to apply voltage to the plurality of blue LED elements of each of the groups. AC voltage is supplied by an AC power source 12 and rectified by a rectifier 13 to supply voltage to the groups of blue LED elements. The control circuit 50 controls to apply voltage to the first group of blue LED elements during an AC voltage supply from an AC power source 12 being low and that controls to apply voltage to the blue LED elements of the first group and the blue LED elements of the second group during the AC voltage supply from the AC power source being high around the AC voltage supply peak. Accordingly, voltage is constantly supplied to the first group of blue LED elements.

Figure 3:
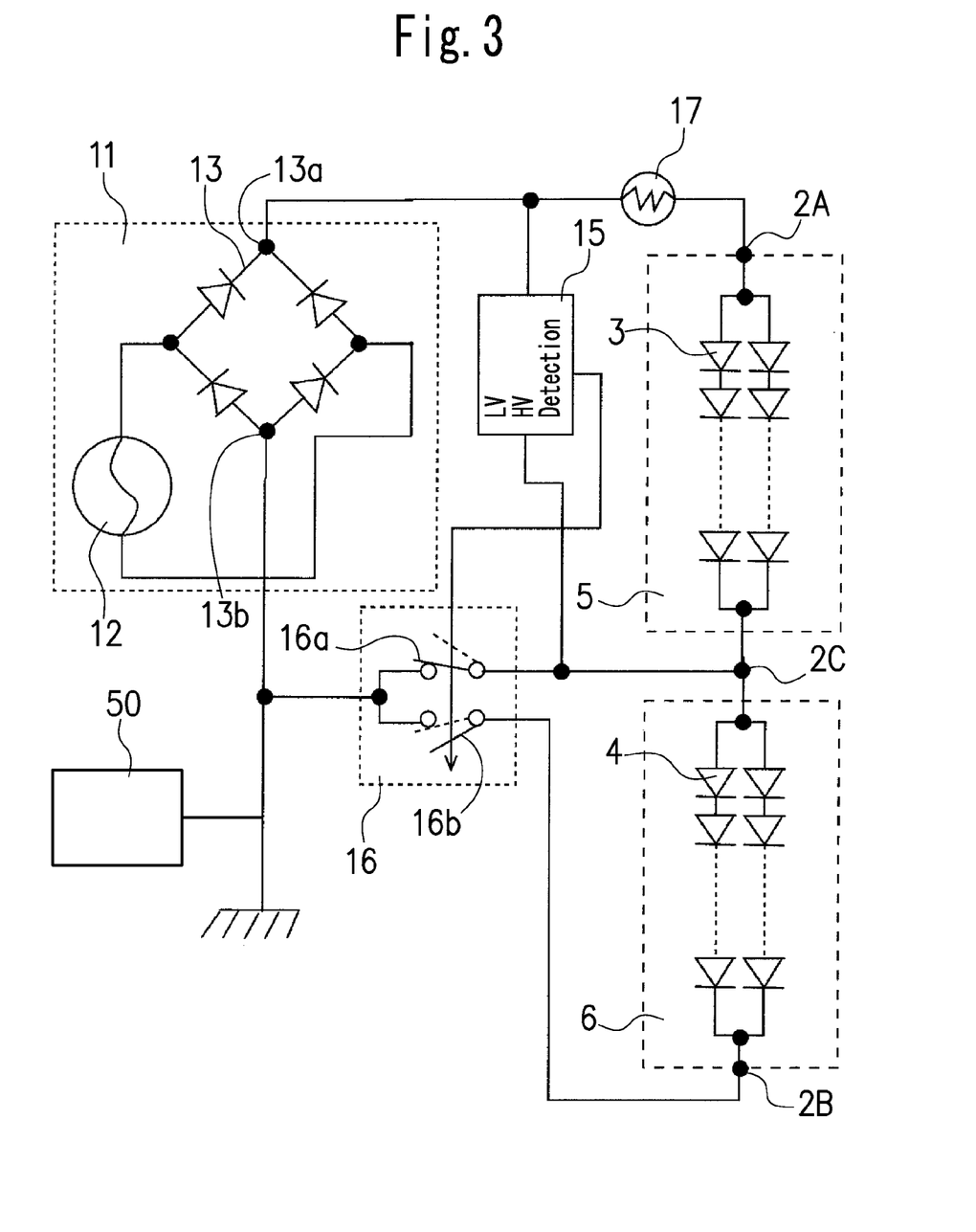
FIG. 3 is a block view showing a drive circuit of the light-emitting device as shown in FIG. 1.

Next, a circuit system and a drive method of a voltage level-switching method of the light-emitting device 10, as shown in FIG. 3 are explained.

In FIG. 3, the first group 3 of blue LED elements and the second group 4 of blue LED elements are electrically connected in series with respect to the first electrode 2A, the second electrode 2C, and the third electrode 2B, as shown in FIG. 1, and the first electrode 2A, the second electrode 2B, and the third electrode 2C are formed as input terminals for the first group 3 of blue LED elements and the second group 4 of blue LED elements. A power source 11 to supply voltage to the first group 3 of blue LED elements and the second group 4 of blue LED elements includes an AC (alternating-current) power source 12 and a rectifier 13 to rectify an AC voltage of the AC power source 12.

The rectifier 13 including terminals 13a, 13b and is connected to the AC power source 12 to rectify AC voltage from the AC power source 12.

A pulse wave signal (hereinafter referred to as an AC voltage) which is configured to perform full-wave rectification as mentioned below is output to the terminals 13a and 13b. In the first embodiment, a power source having AC 120 V and 60 Hz is used as an example of the AC power source 12.

A voltage level detecting circuit or detector circuit 15 which is connected between the rectifier 13 and groups of blue LED elements and detects an AC voltage level (high voltage HV, low voltage LV) and a switching circuit 16 which includes two changing-over switches 16a and 16b are further provided. The switching circuit 16 controls the two changing-over switches 16a and 16b by a detection signal of the detector circuit 15 and is configured to switchably connect the second electrode 2B and the third electrode 2C of the light-emitting device 10 to one terminal 13b of the rectifier 13. Another terminal 13a of the rectifier 13 is connected through a current-limiting element 17 (for example, a resistive element) to the first electrode 2A of the light-emitting device 10.

The light-emitting device 10 includes a control circuit 50 (see FIG. 3). The control circuit 50 controls the detector circuit 15, the switching circuit 16, and light-emission of the first group 3 of blue LED elements and the second group 4 of blue LED elements.

In the aforementioned structure, the control circuit 50 controls the detector circuit 15, the switching circuit 16, the first group 3 of blue LED elements, the second group 4 of blue LED elements, and so on as follows. More specifically, the control circuit 50 is disposed between the power source 11 and the first and second groups 3 and 4 of the blue LED elements to control timing to drive the first group 3 of blue LED elements covered by the fluorescent layer 5 and the second group 4 of blue LED elements covered by the phosphorescent layer 6. The control circuit 50 is configured to constantly drive the first group 3 of blue LED elements.

While the detector circuit 15 detects a low voltage level LV, the switching circuit 16 is maintained to be in a state where the changing-over switch 16a is ON and the changing-over switch 16b is OFF. While the detector circuit 15 detects a high voltage level HV, the switching circuit 16 is switched to a state where the changing-over switch 16a is OFF and the changing-over switch 16b is ON.

Consequently, while the detector circuit 15 detects a low voltage level LV, a connection is established between the first electrode 2A of the light-emitting device 10 and the terminal 13a of the rectifier 13 through the current-limiting element 17, and a current flowing in the first group 3 of blue LED elements reaches from the second electrode 2B to the terminal 13b of the rectifier 13 through the changing-over switch 16a of the switching circuit 16, which is in a state of ON. That is to say, while the detector circuit 15 detects a low voltage level LV, the first group 3 of blue LED elements is connected between the terminals 13a and 13b of the rectifier 13, thereby the light-emitting device emits white light by blue light emission of the first group 3 of blue LED elements and excitation of the fluorescent layer 5 made of YAG, for example.

During the period of the AC drive voltage increasing and the detector circuit 15 detecting a high level HV, if the switching circuit 16 is switched to a state where the changing-over switch 16a is OFF and the changing-over switch 16b is ON, the terminal 13a of the rectifier 13 is connected through the current-limiting element 17 to the first electrode 2A of the light-emitting device 10 and a current flowing in the first group 3 of blue LED elements flows from the second electrode 2B into the second group 4 of blue LED elements, and then flows from the third electrode 2C into the terminal 13b of the rectifier 13 through the changing-over switch 16b which is in a state of ON.

More specifically, while the detector circuit 15 detects a high voltage level HV, the first group 3 of blue LED elements and the second group 4 of blue LED elements are connected in series between the terminals 13a and 13b of the rectifier 13. Consequently, in addition to white light by the blue light emitting from the first group 3 of blue LED elements and the excitation of the YAG fluorescent layer 5, green light excited by the light emitting from the second group 4 of blue LED elements is emitted from the phosphorescent layer 6. As a result, it is possible to accomplish improvement in chromaticity of the white light, because afterglow of green light reduces the appearance of flicker that is caused by characteristics of the AC voltage flow.

Figure 4A:
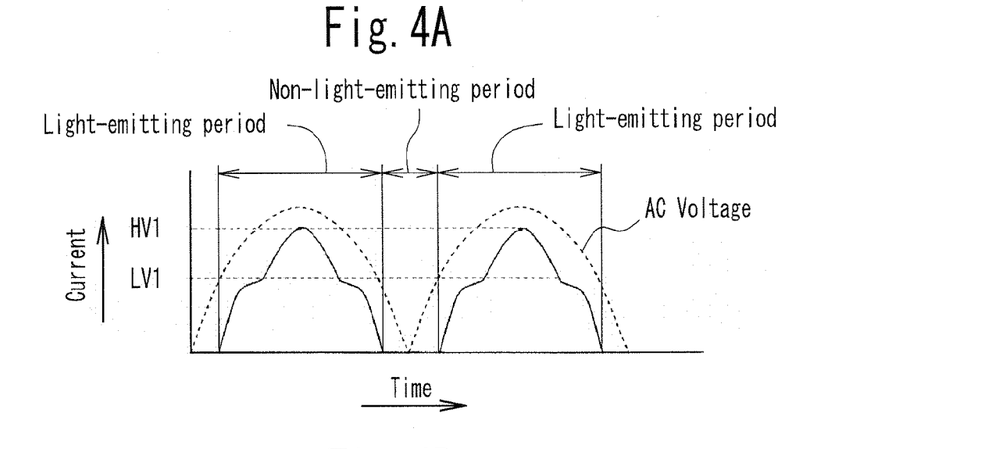
FIGS. 4A to 4C are wave shape views showing drive wave shapes of the light-emitting device as shown in FIG. 1.
Figure 4B:
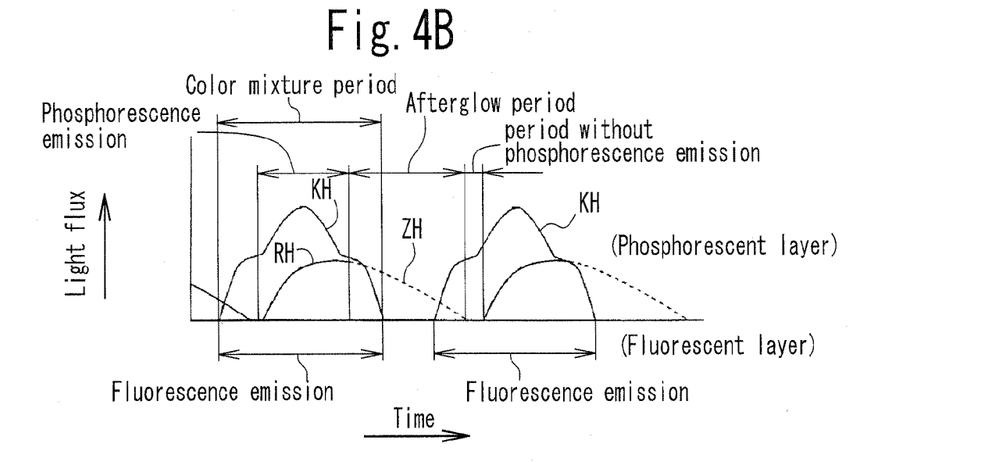
Figure 4C:
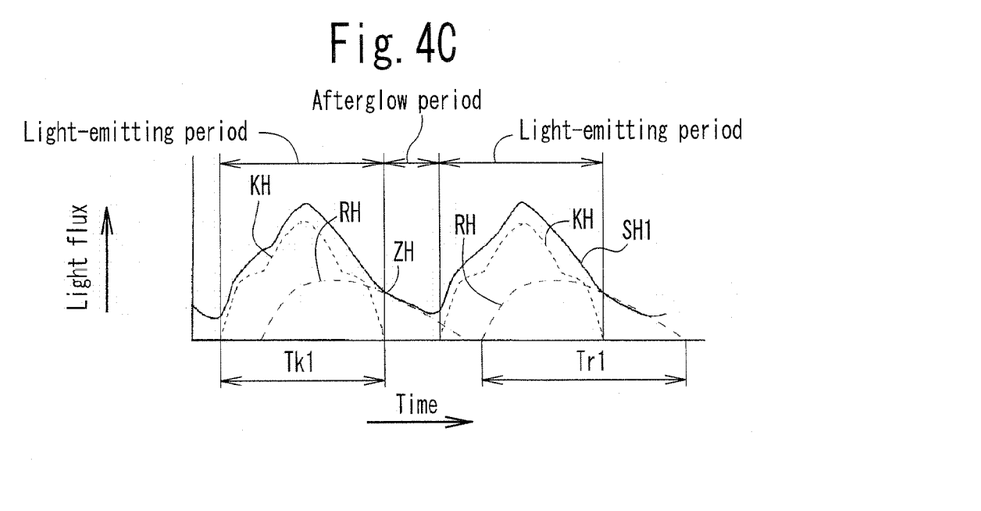

Next, a drive method of the light-emitting device 10 is explained in detail further with reference to wave shape views as shown in FIGS. 4A to 4C.

As mentioned below, a light-emitting period of the first group 3 of blue LED elements depends on the number of serially connected LED elements in the first group 3 of blue LED elements, and a light-emitting period of the second group 4 of blue LED elements depends on the number of serially connected LED elements in the second group 4 of blue LED elements. In the light-emitting device 10 in the first embodiment, the first group 3 of blue LED elements includes thirty (30) serially connected elements and the second group 4 of blue LED elements includes twenty (20) serially connected elements.

FIG. 4A illustrates a drive current of each of the first group 3 of blue LED elements and the second group 4 of blue LED elements, which are driven by voltage. In FIG. 4A, a vertical axis shows a current and a horizontal axis shows a time. As shown in an AC voltage wave shape shown by dotted line, a current flows in the first group 3 of blue LED elements and the second group 4 of blue LED elements. In other words, the AC voltage wave shape repeats mountain-like pulse wave shape, and until the detection level of the detector circuit 15 as shown by the vertical axis is LV1, a current flows only the first group 3 of blue LED elements. Consequently, only the first group 3 of blue LED elements is lighted.

When the detection level is switched from LV1 to HV1, a current flows in the series connection between the first group 3 of blue LED elements and the second group 4 of blue LED elements, as shown in FIG. 3, the phosphorescent layer 6 in addition to the lighting of the fluorescent layer 5 is lighted. A period in which a current flows in the first group 3 of blue LED elements and the second group 4 of the blue LED elements, and thereby they are lighted is a light-emitting period. On the contrary, because a current does not flow in the first group 3 of blue LED elements while the AC voltage is lower than a threshold voltage of the first group 3 of blue LED elements, this period is a non-light-emitting period in which the light emitting is not performed. The non-light-emitting period of the first group 3 of blue LED elements becomes a source of trouble of flicker. Here, in the explanation of light-emitting wave shapes, a light-emitting wave shape of the fluorescent layer 5 is referred to as KH, a light-emitting wave shape of the phosphorescent layer 6 RH, an afterglow wave shape of the phosphorescent layer 6 ZH, and a total wave shape necessary to the light-emitting device 10, in which the light-emitting wave shape KH, the light-emitting wave shape RH, and the afterglow wave shape ZH are added SH.

FIG. 4B illustrates a light-emitting wave shape KH of the fluorescent layer 5 by the first group 3 of blue LED elements, a light-emitting state of the phosphorescent layer 6 by the second group 4 of blue LED elements, a light-emitting wave shape RH (shown by solid line) of the phosphorescent layer 6 while a drive current flows in the second group 4 of blue LED elements, and an afterglow wave shape ZH (shown by dotted line) of the phosphorescent layer 6 while a drive current cease to flow in the second group 4 of blue LED elements.

In other words, the second group 4 of blue LED elements initiates light emission when the AC voltage enters an area of HV1 that includes AC power supply peak, but when the AC voltage returns to an area of LV1, the light emission from the blue LED elements of the second group 4 is stopped. Accordingly, a period at which the AC voltage is in the area of HV1 is a light-emitting period of the first group and the second group of blue LED elements, and phosphorescence emission RH is also output. However, because the phosphorescence emission RH has afterglow, even after a current cease to flow in the second group 4 of blue LED elements, afterglow emission remains for a certain period, that is an afterglow period after the current cease to flow in the second group of blue LED elements. Even if a slight non-light-emitting period occurs in a period from the termination of the afterglow period to a light-emitting period of the phosphorescence emission RH by the next AC voltage, it is useful to reduce the appearance of flicker. An overlapping portion of the light-emitting wave shape KH of the fluorescent layer 5 and a part of the light-emitting wave shape RH of the phosphorescent layer 6 and the afterglow wave shape ZH of the phosphorescent layer 6 is a color mixture period MC, if the period MC is longer, a light-emitting device having good chromaticity can be acquired.

FIG. 4C illustrates the total wave shape SH1 of the light-emitting device 10, and a wave shape in which the light-emitting wave shape KH of the fluorescent layer 5 shown in FIG. 4B, the light-emitting wave shape RH of the phosphorescent layer 6, and the afterglow wave shape ZH of the phosphorescent layer 6 (each thereof is shown by dotted line) are added. In other words, a continuous light-emitting device with less appearance of flicker caused by characteristics of the AC drive can be structured by covering a non-light-emitting period between the light-emitting periods (color mixture periods) of the light-emitting period KH of the fluorescent layer 5 and the light-emitting wave shape RH of the phosphorescent layer 6 with an afterglow period by the afterglow wave shape ZH.

Meanwhile, when the light-emitting period by the fluorescent layer 5 is Tk and the light-emitting time (total time of the light-emitting wave shape RH and the afterglow wave shape ZH) of the light-emitting period by the phosphorescent layer 6 is Tr, it is possible to adjust the light-emitting times Tk and Tr in the light-emitting periods by changing the number of connected LED elements of the first group 3 of blue LED elements and the second group 4 of blue LED elements, by this adjustment, it is possible to prevent flicker of light from occurring and control color tone of emitted light. If a light-emitting device gives priority to its brightness and a third group including a plurality of blue LED elements is provided, it is preferable that another fluorescent layer is disposed to receive light from the third group of blue LED elements. This is because fluorescent emission is generally brighter than phosphorescence emission.

However, if a light-emitting device gives priority to reduce the appearance of flicker, it is preferable that another phosphorescent layer is disposed to receive light from the third group of blue LED elements. This is because phosphorescent emission can be achieved from the second group and the third group of blue light-emitting diode elements covered by the phosphorescent layers in this case, and afterglow light of phosphorescent emission can be accumulated.

As mentioned above, the control circuit 50, depending on the voltage level of the power source 11, can control the first group 3 of blue LED elements and the second group 4 of blue LED elements and/or more groups of blue LED elements to drive the first group 3 of blue LED elements first of all of the groups of blue LED elements and then the second group 4 of blue LED elements and/or more groups of blue LED elements. In addition, the control circuit 50 can control the first group 3 of blue LED elements and the second group 4 and/or more groups of blue LED elements to drive the first group 3 of blue LED elements constantly and the second group 4 and/or more groups of blue LED elements as necessary.

<Second Embodiment>

Next, drive wave shapes of a light-emitting device 20 according to a second embodiment of the present invention are explained with reference to FIGS. 5A to 5C.

Figure 5A:
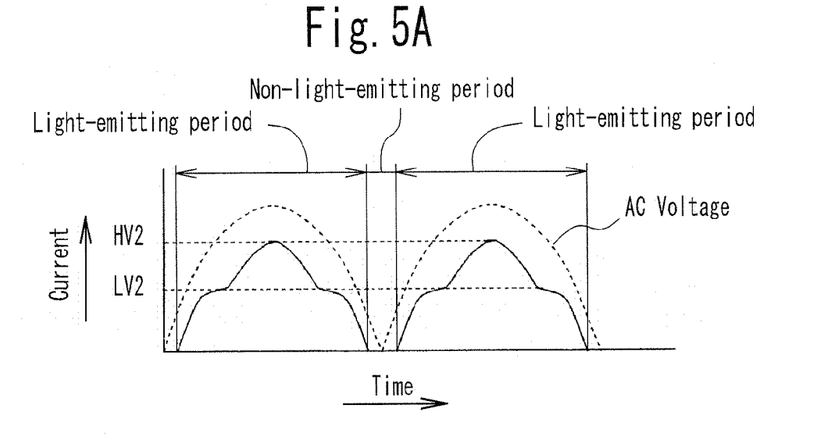
FIGS. 5A to 5C are wave shape views showing drive wave shapes of a light-emitting device according to a second embodiment of the present invention.
Figure 5B:
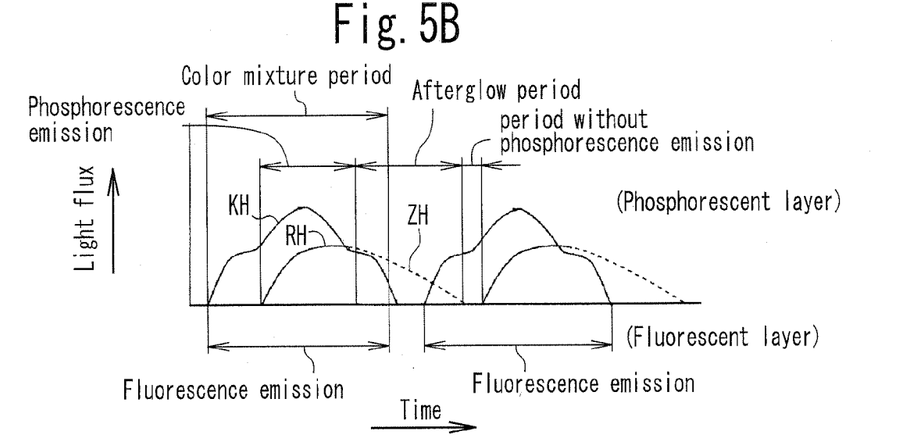
Figure 5C:
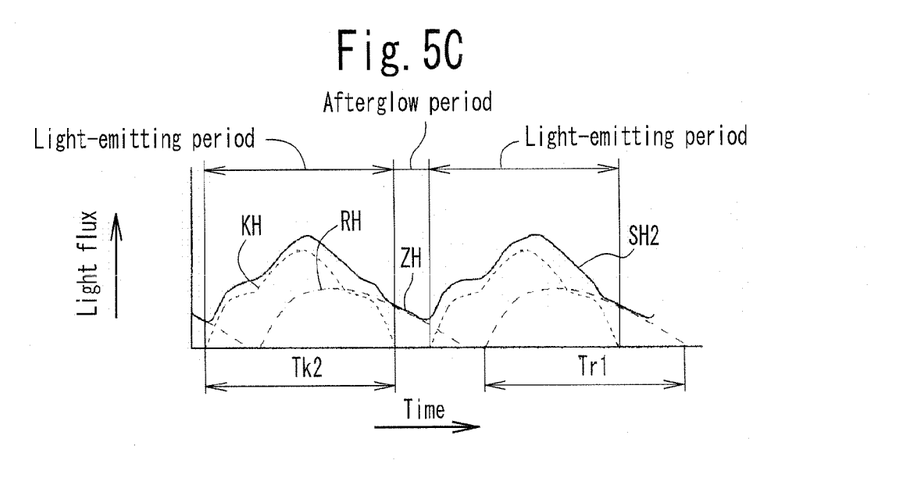

A drive wave shape of the light-emitting device 20 shown in each of FIGS. 5A to 5C correspond to the drive wave shape of the light-emitting device 10 shown in each of FIGS. 4A to 4C, respectively, identical reference sign is attached to the similar wave shape, the duplicate description is omitted. That is to say, in the light-emitting device 10, the first group 3 of blue LED elements has the thirty LED elements which are electrically connected in series to the electrodes and the second group 4 of blue LED elements has the twenty LED elements which are electrically connected in series to the electrodes. On the contrary, in the light-emitting device 20, the first group 3 of blue LED elements has twenty LED elements which are electrically connected in series to the electrodes and the second group 4 of blue LED elements has twenty LED elements which are electrically connected in series to the electrodes, the number of which is the same as that of the first group 3 of blue LED elements.

As mentioned above, in the light-emitting device 20, the first group 3 of blue LED elements has the twenty LED elements lesser than the first group 3 of blue LED elements of the light-emitting device 10, and the second group 4 of blue LED elements has the same twenty LED elements as the first group 3 of blue LED elements of the light-emitting device 10. Consequently, as shown in FIG. 5A, a current wave shape is changed, and a voltage detection level reduces from LV1 to LV2, and HV2 reduces by a reduced amount of the voltage detection level. In other words, as a result of reduction of the number of blue LED elements of the first group 3 in the light-emitting device 20 in compared with the light-emitting device 10, the detected levels LV2 and HV2 by the detector circuit 15 in the light-emitting device 20 are reduced to be smaller than the detected levels LV1 and LV2 of the light-emitting device 10.

Consequently, as shown in FIG. 5A, a current wave shape has a long light-emitting period and a short non-light-emitting period. Instead, it is demonstrated that the current wave shape has generally a low shape. Consequently, as shown in FIG. 5B, a light-emitting wave shape KH of the fluorescent layer 5 has a long light-emitting period Tk2. Because a light-emitting period Tr1 of the phosphorescent layer 6 in which a light-emitting wave shape RH and an afterglow wave shape ZH of the phosphorescent layer 6 are added, does not change, a color mixture period is longer than that of the light-emitting device 10. As shown in FIG. 5C, a shape of a total wave shape SH2 of the light-emitting device 20 has a light flux slightly lesser than, but a color mixture period longer than and an afterglow compensation better than that of the light-emitting device 10. Consequently, flicker of light during the light-emitting period or occurrence of the non-light-emitting periods between the light-emitting periods caused by the AC drive can be improved, and as a result, a light-emitting characteristic having a good chromaticity can be acquired.

<Third Embodiment>

Figure 6A:
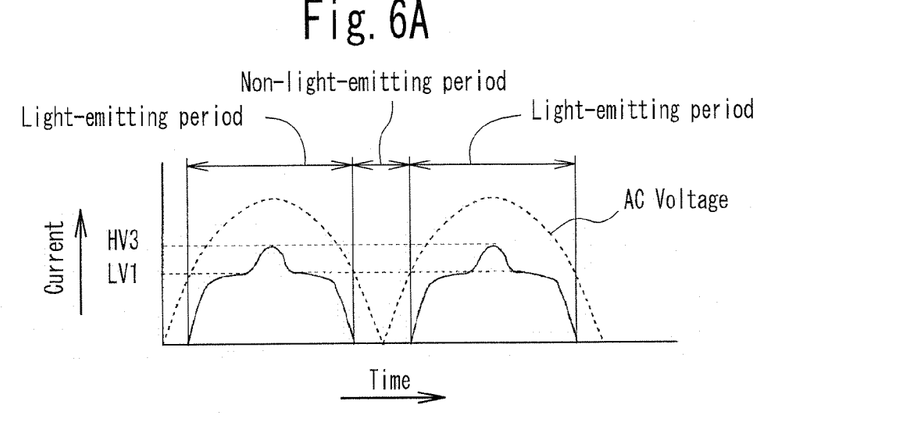
FIGS. 6A to 6C are wave shape views showing drive wave shapes of a light-emitting device according to a third embodiment of the present invention.
Figure 6B:
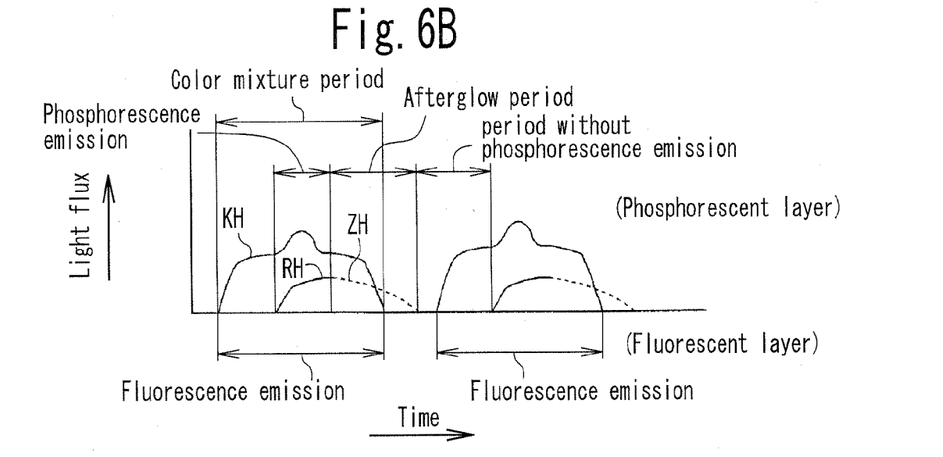
Figure 6C:
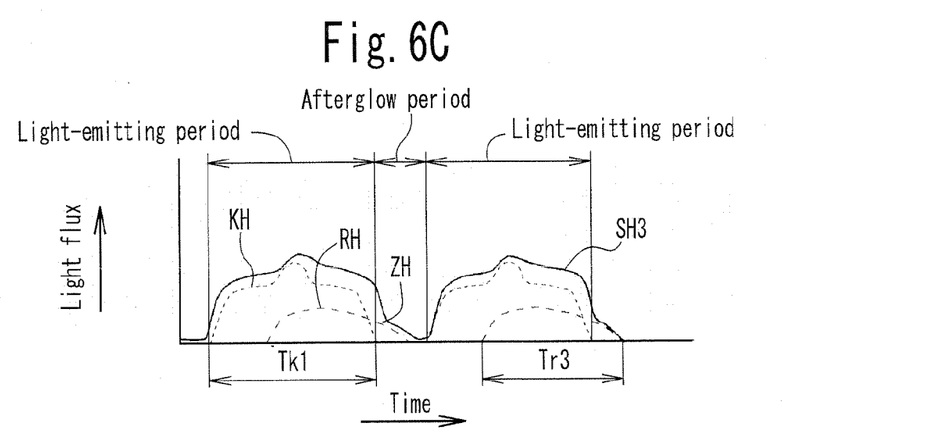

Next, drive wave shapes of a light-emitting device 30 according to a third embodiment of the present invention, shown in FIGS. 6A to 6C are explained.

A drive wave shape of the light-emitting device 30 shown in each of FIGS. 6A to 6C correspond to the drive wave shape of the light-emitting device 10 shown in each of FIGS. 4A to 4C, respectively, identical reference sign is attached to the similar wave shape, the duplicate description is omitted. That is to say, in the light-emitting device 30, the first group 3 of blue LED elements has the thirty LED elements which are the same as in the light-emitting device 10, and the second group 4 of blue LED elements has the ten LED elements which are lesser than that of the light-emitting device 10.

Accordingly, as shown in FIG. 6A, a current wave shape changes, a voltage detection level LV1 does not change, and a voltage detection level is significantly reduced from HV1 (see FIG. 4A) to HV3. In other words, as result of reduction of the number of LED elements of the second group 4 of blue LED elements, A portion HV of detection levels LV1 and HV3 by the detector circuit 15 in the light-emitting device 30 is reduced, compared with the detection levels LV1 and HV1 in the light-emitting device 10. Consequently, as shown in FIG. 6B, a light-emitting wave shape KH of the fluorescent layer 5 does not change, and only a light-emitting wave shape RH of the phosphorescent layer 6 is changed.

That is to say, as a result of reduction of the number of LED elements of the second group 4 of blue LED elements, the light-emitting wave shape RH of the phosphorescent layer 6 has a light-emitting period Tr3. This period is significantly shorter than the light-emitting period Tr1 of the light-emitting device 10. The detection levels by the detector circuit 15 in the light-emitting device 30 are LV1 and HV3, compared with the detection levels LV1 and HV1 in the light-emitting device 10, a light flux is reduced entirely.

In the light-emitting device 30, because the light-emitting wave shape RH and the afterglow wave shape ZH are small, as shown in FIG. 6B, an overlapping color mixture period of the light-emitting wave shape KH of the fluorescent layer 5, the light-emitting wave shape RH of the phosphorescent layer 6, and the afterglow wave shape ZH of the phosphorescent layer 6 becomes very short, further, non-light-emitting period of the phosphorescent layer 6 becomes long. As shown in FIG. 6C, because the total wave shape SH3 of the light-emitting device 30 has a short color mixture period, fluorescent light from the first group 3 of blue LED elements is emitted to be stronger than phosphorescence from the second group 4 LED elements, and therefore good chromaticity cannot been acquired. In addition, because a space occurs in the afterglow period, it is difficult to prevent flicker from occurring.

As mentioned above, in this embodiment, it is possible to prevent the flicker from occurring by the light-emission or afterglow of the phosphorescent layer 6 and change a light-emitting period of the light-emitting period of the fluorescent layer 5 or the phosphorescent layer 6, by changing the number of the LED elements of the first group 3 blue LED elements or the second group 4 of blue LED elements. In addition, because a height of the light flux can be changed, by combining selection of the changes of the number of LED elements and the height of the light flux, because the afterglow period of the phosphorescent layer 6 can be controlled, it is possible to use phosphorescent layers having different afterglow period extensively. For example, after considering the flicker, a bright light-emitting device having a high light flux similar to the light-emitting device 10 can be provided and it can be selected that a light-emitting device having a long color mixture period, that is, a better chromaticity similar to the light-emitting device 20 is acquired.

<Fourth Embodiment>

Next, drive wave shapes of a light-emitting device 40 according to a fourth embodiment of the present invention are explained with reference to FIG. 7.

Figure 7:
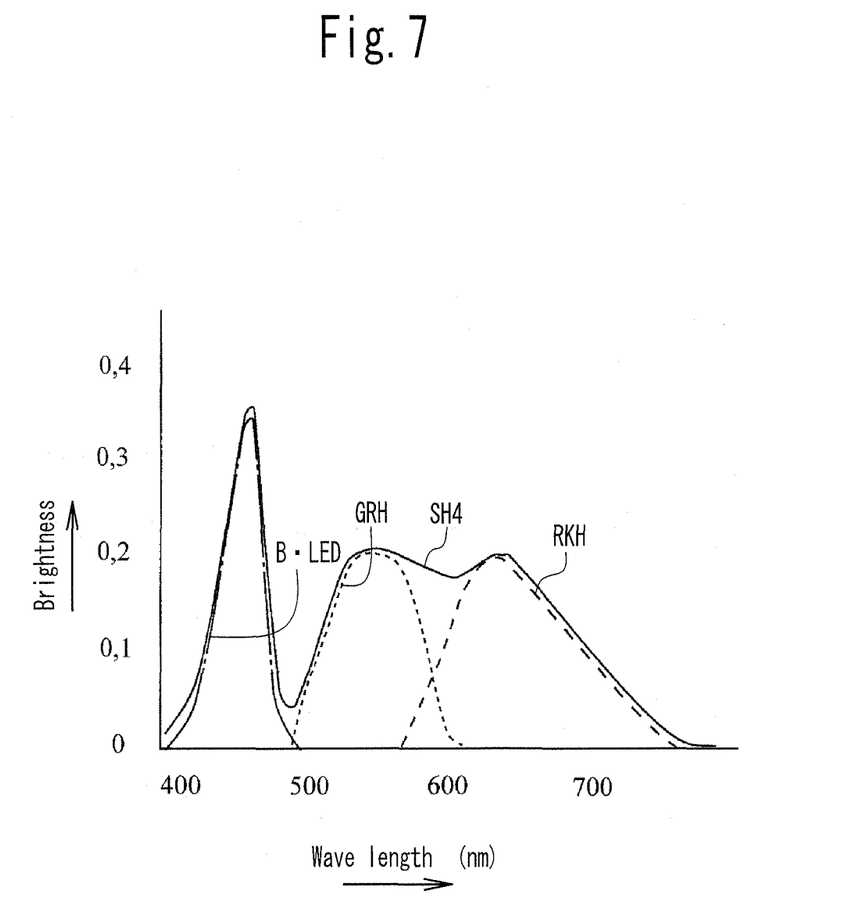
FIG. 7 is a wave shape view showing drive wave shapes of a light-emitting device according to a fourth embodiment of the present invention.

The light-emitting device 40 having the drive wave shapes as shown in FIG. 7 is the same basic structure as the light-emitting device 10 as shown in FIG. 1, but differs from the light-emitting device 10 in that a fluorescent layer RKH emitting red light is used instead of the fluorescent layer 5 covering the first group 3 of blue LED element.

Consequently, as shown in FIG. 7, a total wave shape SH4 of the light-emitting device 40 has a constant brightness obtained in an area of each frequency band, a light-emitting characteristic of a relatively good chromaticity is obtained, by a color mixture effect of a light-emitting wave (400 to 450 nm) B·LED of blue LED elements, a light-emitting wave (500 to 600 nm) GRH of green phosphorescent layer, and a light-emitting wave (570 to 750 nm) RKH, although a valley exits between the light-emitting wave (400 to 450 nm) B·LED and the light-emitting wave (500 to 600 nm) GRH.

As mentioned above, in this embodiment, it is possible to provide a light-emitting device driven by an AC voltage and without occurring flicker by use of the fluorescent layer and the phosphorescent layer excited by the lighting of the LED elements. In addition, the plurality of LED elements are divided into the first group 3 of blue LED elements and the second group 4 of blue LED elements, and the fluorescent layer 5 and the phosphorescent layer 6 are applied to the first group 3 of blue LED elements and the second group of blue LED elements, respectively. For example, if a material for a fluorescent layer and a material for the phosphorescent layer are mixed in a transparent resin, by a mixture of two kinds of particles, uneven distribution of particles occurs in the transparent resin, it is difficult to obtain uniform light-emitting characteristic. On the contrary, in the structure as mentioned above, by mixing the two kinds of particles in the transparent resin separately, it is possible to form a cover layer by which uniform light-emitting characteristic can be obtained. In addition, because accurate control of an afterglow period is possible by use of predetermined number of LED element groups, it is possible to use a wide range of materials for a phosphorescent layer.

<Fifth Embodiment>

Figure 8:
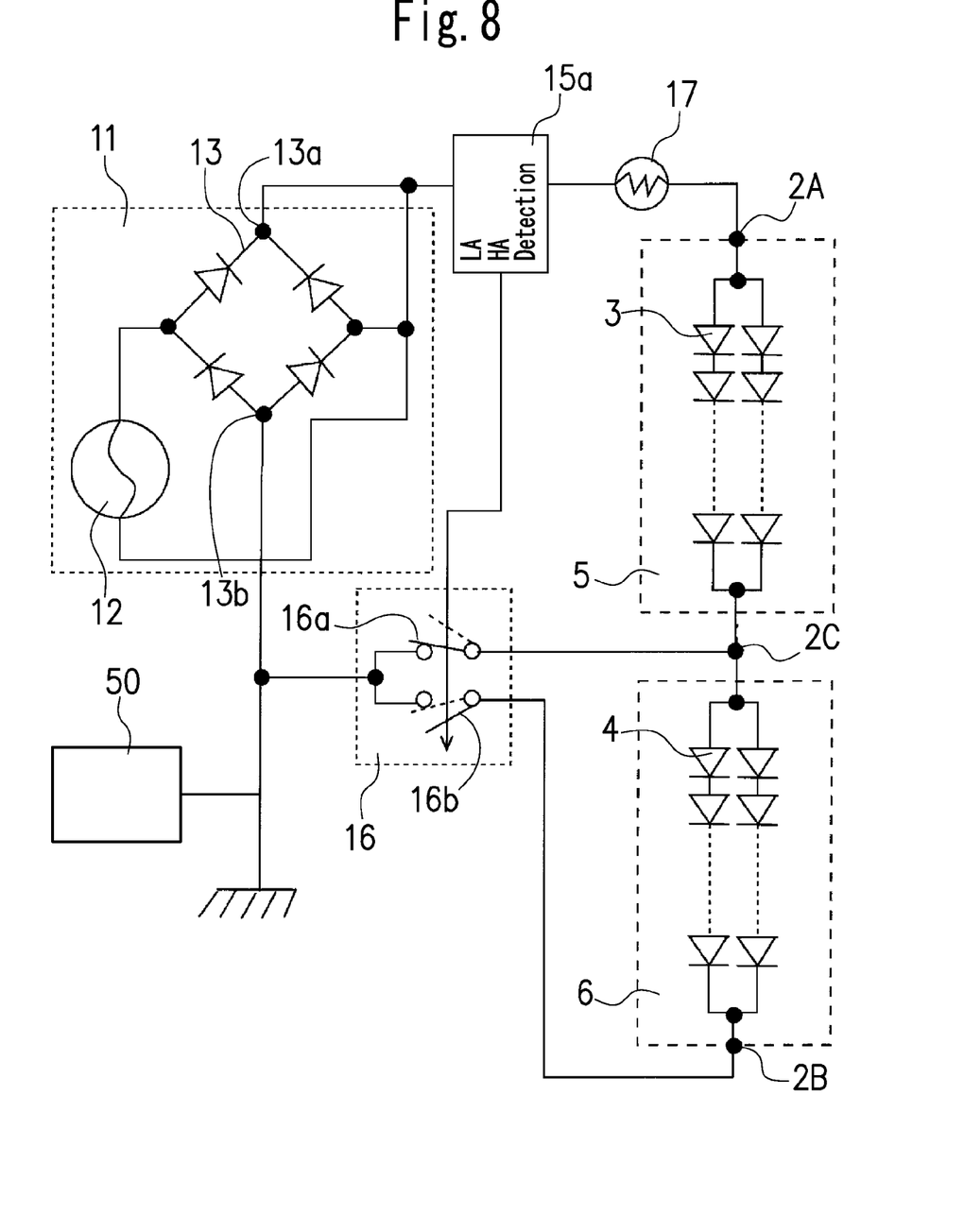
FIG. 8 is a system block view showing a drive circuit of a light-emitting device according to a fifth embodiment of the present invention.

Next, a circuit system and a drive method of a current-level switching system of a light-emitting device, as shown in FIG. 8 are explained. The circuit system as shown in FIG. 8 has basically the same structure as the circuit system as shown in FIG. 3, identical reference numbers are attached to similar parts, duplicate descriptions are omitted. The circuit system as shown in FIG. 8 differs from the circuit system as shown in FIG. 3 in the following point.

In the circuit system of the current-level switching system as shown in FIG. 3, a control of the switching circuit 16 to achieve switching connection of the first group 3 of blue LED elements and the second group 4 of blue LED elements is performed based on a voltage level detection of the detector circuit 15. On the contrary, in the circuit system of the current-level switching system as shown in FIG. 8, the control of the switching circuit 16 is performed based on a current level detection of a detector circuit 15*a* which is a current-level detector circuit. That is to say, the detector circuit 15*a* performs a current control as shown in FIGS. 4A, 5A and 6A by detection signals of current levels LA and HA, thereby each light-emitting device is operated.

The light-emitting device in each of the embodiments as mentioned above includes the first group 3 of blue LED elements that is mounted on the substrate and the second group 4 of blue LED elements that is mounted on the substrate and electrically connected to the first group 3 of blue LED elements, and the first group 3 is covered by the fluorescent layer 5 and the second group 4 is covered by the phosphorescent layer 6. Consequently, it is possible to prevent flicker from occurring in a white light-emitting structure formed by the first group 3 of blue LED elements and the fluorescent layer 5 by a light-emitting structure formed by the second group 4 of blue LED elements and the phosphorescent layer 6, and to improve chromaticity of the light emission by, first, driving the first group 3 of blue LED elements and then the second group 4 of blue LED elements depending on a voltage level of the AC power source. In addition, it is possible to accomplish a long operating life of the light-emitting device by lighting the fluorescent layer by constantly driving the first group 3 of blue LED elements and by shortening a drive period of the second group 4 of blue LED elements which has a relatively short operating life, thereby reducing a lighting period of the phosphorescent layer 6.

Here in the first group of blue LED elements, a predetermined number of first light-emitting elements are connected in series, in the first group of blue LED elements, a predetermined number of first light-emitting elements are connected in series, and the control circuit 50 controls a light-emitting period of the fluorescent layer 5 based on the first light-emitting elements and controls a light-emitting period of the phosphorescent layer 6 based on the second light-emitting elements. With this structure, because the light-emitting period of the fluorescent layer 5 and the light-emitting period of the phosphorescent layer 6 are controlled by the control circuit 50, the chromaticity of the light emitting can be adjusted.

The fluorescent layer 5 covering the first group 3 of blue LED elements may be a yellow-system YAG fluorescent material that emits yellow light, and the phosphorescent layer 6 covering the second group 4 of blue LED elements may be a green-system phosphorescence that emits green light.

The phosphorescent layer 6 covering the second group 4 of blue LED elements may be a mixed layer including a first phosphorescence that emits green light and a second phosphorescence that emits red light.

The fluorescent layer 5 covering the first group 3 of blue LED elements may be a nitride material that is oxide to emit red light and the phosphorescent layer 6 covering the second group 4 of blue LED elements may be phosphorescence that emits green light.

Figure 11:
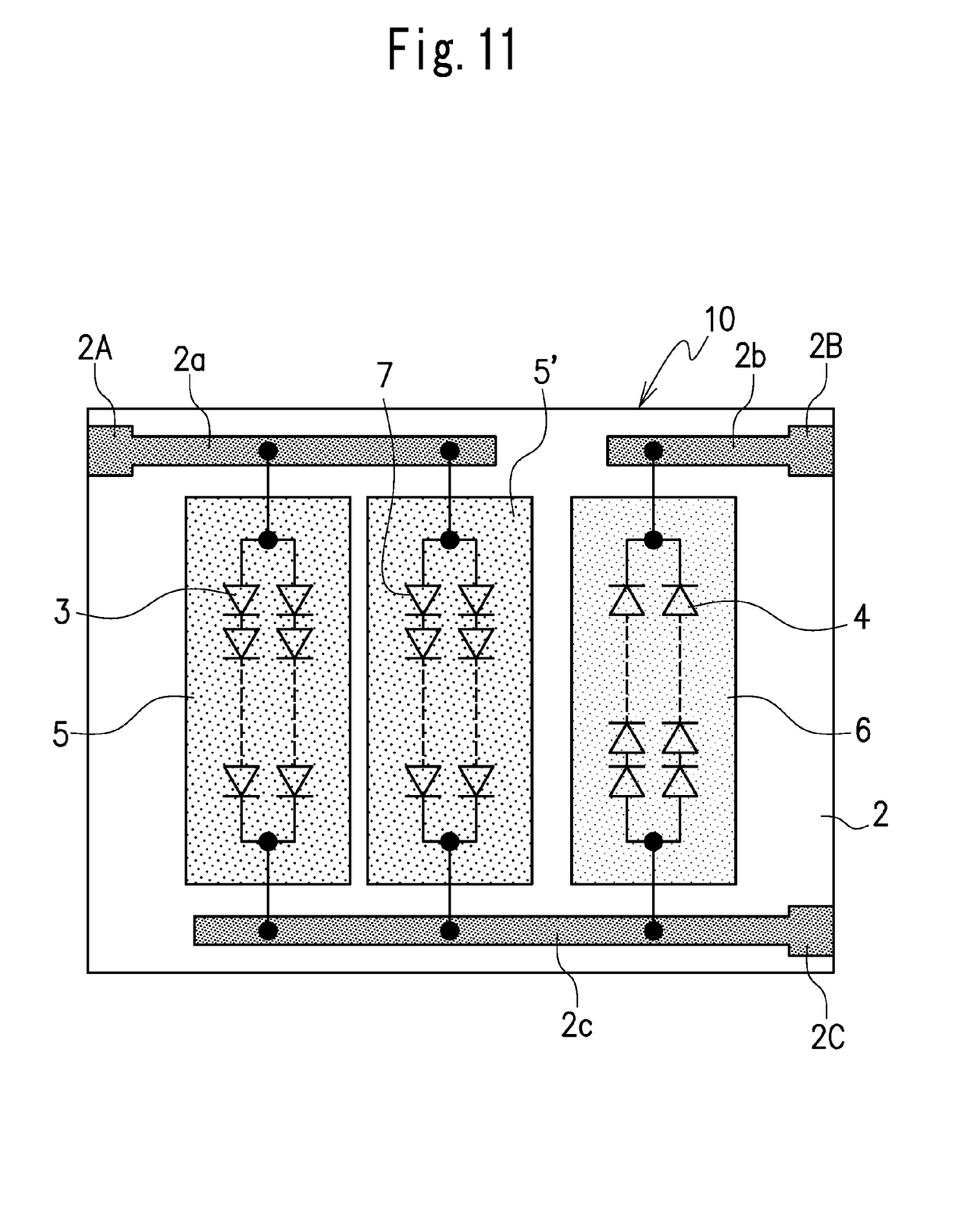
FIG. 11 is a plan view showing a light-emitting device according to another embodiment of the present invention.

According to another embodiment illustrated in FIG. 11, a second fluorescent layer 5' is disposed to receive light from the third group of blue light-emitting diode elements 7. In this embodiment, the fluorescent layer 5 disposed to receive light from the first group 3 of blue light-emitting diode elements being defined as a first fluorescent layer.

Figure 12:
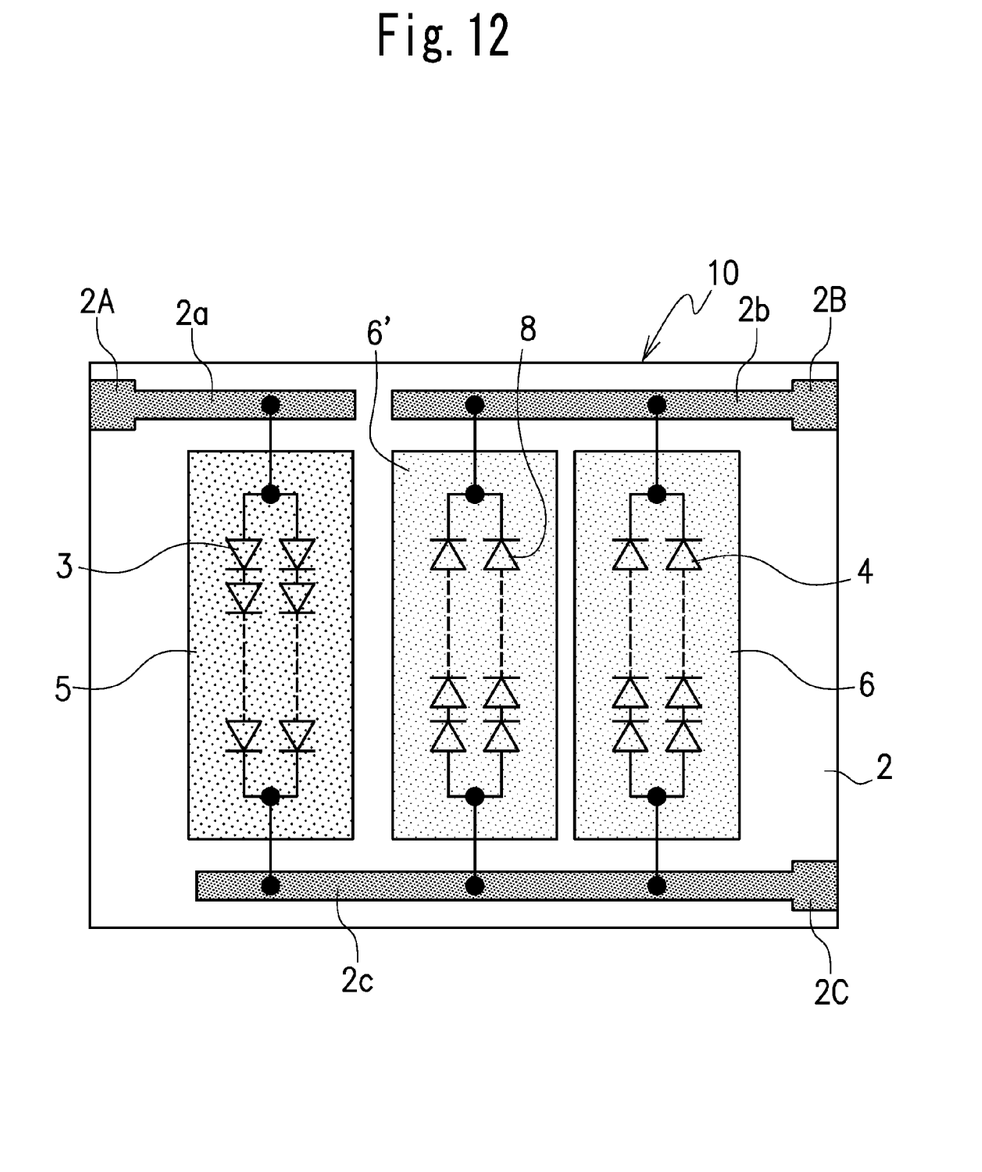
FIG. 12 is a plan view showing a light-emitting device according to another embodiment of the present invention.

According to another embodiment illustrated in FIG. 12, a second phosphorescent layer 6' is disposed to receive light from the third group 8 of blue light-emitting diode elements. In this embodiment, the phosphorescent layer 6 disposed to receive light from the second group 4 of blue light-emitting diode elements being defined as a first phosphorescent layer.

As mentioned above, in each embodiment, by applying the fluorescent layer and the phosphorescent layer to the first group of blue LED elements and the second group of blue LED elements, separately, changing the number of the LED elements of the first group of blue LED elements and the second group of blue LED elements, and changing the light-emitting period of each of the fluorescent layer and the phosphorescent layer optionally, it is possible to provide a light-emitting device having various light-emitting characteristic as necessary.

In addition, in each embodiment, although the green phosphorescent layer as the phosphorescent layer covering the second group of blue LED element is exemplified, if a mixture layer of a green-system phosphorescent layer and a red-system phosphorescent layer is used, further improvement in chromaticity can be expected. In the embodiments as mentioned above, although the LED elements of the first group and the second group are contained in one package, the LED elements of each of the first group and the second group may be contained in a separate package.

Although the preferred embodiments of the present invention have been described, it should be understood that the present invention is not limited to these embodiments, various changes and modifications can be made to the embodiments.

What is claimed is:

1. A light-emitting device comprising:
   a substrate including a first electrode, a second electrode, and a third electrode;
   a first group including a plurality of blue light-emitting diode elements that are electrically connected to the first electrode and the second electrode;
   a second group including a plurality of blue light-emitting diode elements that are electrically connected to the second electrode and the third electrode;
   a fluorescent layer directly covering or being arranged above the first group of blue light-emitting diode elements to receive light from the first group of blue light-emitting diode elements; and
   a phosphorescent layer with an afterglow characteristic, directly covering or being arranged above the second group of blue light-emitting diode elements to receive light from the second group of blue light-emitting diode elements,
   wherein the first group of blue light-emitting diode elements is configured to start to be driven at a first level of voltage, and the second group of blue light-emitting diode elements is configured to start to be driven at a second level of voltage that is higher than the first level of voltage, and to be lighted together with the first group of blue light-emitting diode elements while the voltage is applied to the light-emitting device,
   wherein the fluorescent layer is configured to emit light that is different in color from light that is configured to be emitted from the phosphorescent layer, and
   wherein the first group of blue light-emitting diode elements are directly covered by the fluorescent layer, and the second group of blue light-emitting diode elements are directly covered by the phosphorescent layer, and
   the light-emitting device further comprising a control circuit that is electrically connected to a switching circuit to switch to apply voltage to the plurality of blue light-emitting diode elements of the first group during an AC voltage supply from an AC power source being low and to switch to apply voltage to the blue light-emitting diode elements of the first group and the blue light-emitting diode elements of the second group during the AC voltage supply from the AC power source being high around the AC voltage supply peak.

2. The light-emitting device according to claim 1:
the fluorescent layer directly covering the plurality of blue light-emitting diode elements of the first group;
the phosphorescent layer directly covering the plurality of blue light-emitting diode elements in the second group;
the first electrode being electrically in contact with a first electrode pattern and the third electrode being electrically in contact with a third electrode pattern, and the first electrode pattern and the third electrode pattern being separately extended along one side of the substrate; and
the second electrode being electrically in contact with a second electrode pattern that is extended along an opposite side opposite to the one side of the substrate.

3. The light-emitting device according to claim 2 further comprising:
a power source including a rectifier, and an AC power source that is electrically connected to the rectifier to apply voltage to the blue light-emitting diode elements of the first group and the blue light-emitting diode elements of the second group;
a control circuit that is electrically connected to a switching circuit and disposed between the power source and the first group and the second group of blue light-emitting diode elements;
the control circuit that is electrically connected to the switching circuit being configured to control to apply voltage to the first electrode, through the blue light-emitting diode elements of the first group, to the second electrode during the AC voltage supply from the AC power source being low, and the control circuit that is connected to the switching circuit being configured to control to apply voltage to the first electrode, through the blue light-emitting diode elements of the first group, the second electrode, and the blue light-emitting diode elements of the second group to the third electrode during the AC voltage supply from the AC power source being high around the AC voltage supply peak.

4. The light-emitting device according to claim 1 further comprising:
a power source;
a control circuit that is electrically disposed between the power source and
the first group and the second group of blue light-emitting diode elements and that is configured to control timings to apply voltage to the blue light-emitting diode elements of the second group.

5. The light-emitting device according to claim 4:
wherein the control circuit is configured to constantly apply voltage to the blue light-emitting diode elements of the first group during an AC power from an AC power source being supplied.

6. The light-emitting device according to claim 1:
the fluorescent layer including YAG material that emits yellow light; and
the phosphorescent layer including phosphorescence that emits green light.

7. The light-emitting device according to claim 1:
wherein the phosphorescent layer is a mixed layer including a first phosphorescence that emits green light and a second phosphorescence that emits red light.

8. The light-emitting device according to claim 1:
wherein the fluorescent layer including nitride material that is oxide to emit red light and the phosphorescent layer includes phosphorescence that emits green light.

9. The light-emitting device according to claim 1 further comprising:
a third group including a plurality of blue light-emitting diode elements that are electrically connected to the electrodes; and
a second fluorescent layer disposed to receive light from the third group of blue light-emitting diode elements, and wherein the fluorescent layer disposed to receive light from the first group of blue light-emitting diode elements forms the first fluorescent layer.

10. The light-emitting device according to claim 1 further comprising:
a third group including a plurality of blue light-emitting diode elements that are electrically connected to the electrodes; and
a second phosphorescent layer disposed to receive light from the third group of blue light-emitting diode elements, and wherein the phosphorescent layer disposed to receive light from the second group of blue light-emitting diode elements forms the first phosphorescent layer.

11. The light-emitting device according to claim 1,
wherein the fluorescent layer is disposed above the first group of blue light-emitting diode elements, and the phosphorescent layer is disposed above the second group of blue light-emitting diode elements.

12. A light-emitting device comprising:
a substrate including a first electrode, a second electrode, and a third electrode;
a first group including a plurality of blue light-emitting diode elements that are electrically connected to the first electrode and the second electrode;
a second group including a plurality of blue light-emitting diode elements that are electrically connected to the second electrode and the third electrode;
a fluorescent layer directly covering or being arranged above the first group of blue light-emitting diode elements to receive light from the first group of blue light-emitting diode elements;
a phosphorescent layer with an afterglow characteristic, directly covering or being arranged above the second group of blue light-emitting diode elements to receive light from the second group of blue light-emitting diode elements; and
a control circuit that is electrically connected to a switching circuit to switch to apply voltage to the blue light-emitting diode elements of the first group during an AC voltage supply from an AC power source being low and to switch to apply voltage to the blue light-emitting diode elements of the first group and the blue light-emitting diode elements of the second group during the AC voltage supply from the AC power source being high around the AC voltage supply peak,
wherein the first group of blue light-emitting diode elements is configured to start to be driven at a first level of voltage, and the second group of blue light-emitting diode elements is configured to start to be driven at a second level of voltage that is higher than the first level of voltage, and to be lighted together with the first group of blue light-emitting diode elements while the voltage is applied to the light-emitting device,
wherein the fluorescent layer is configured to emit light that is different in color from light that is configured to be emitted from the phosphorescent layer,
the light-emitting device further comprising a third group including a plurality of blue light-emitting diode elements that are electrically connected to the electrodes; a second phosphorescent layer disposed to receive light from the third group of blue light-emitting diode elements, and the phosphorescent layer disposed to receive light from the second group of blue light-emitting diode elements being defined as a first phosphorescent layer; and the control circuit that is electrically connected to a switching circuit to switch to apply voltage to the blue light-emitting diode elements of the first group during the AC voltage supply from the AC power source being low and to switch to apply voltage to the blue light-emitting diode elements of the first group, the blue light-emitting diode elements of the second group, and the blue light-emitting diode elements of the third group during the AC voltage supply from the AC power source being high around the AC voltage supply peak.

13. The light-emitting device according to claim 12 further comprising:
a third group including a plurality of blue light-emitting diode elements that are electrically connected to the first electrode and the second electrode;
a second fluorescent layer disposed to receive light from the third group of blue light-emitting diode elements, and the fluorescent layer disposed to receive light from the first group of blue light-emitting diode elements being defined as a first fluorescent layer; and
the control circuit that is electrically connected to a switching circuit to switch to apply voltage to the blue light-emitting diode elements of the first group during the AC voltage supply from the AC power source being low and to switch to apply voltage to the blue light-emitting diode elements of the first group, the blue light-emitting diode elements of the second group, and the blue light-emitting diode elements of the third group during the AC voltage supply from the AC power source being high around the AC voltage supply peak.

14. The light-emitting device according to claim 11,
wherein the first group of blue light-emitting diode elements are directly covered by the fluorescent layer, and the second group of blue light-emitting diode elements are directly covered by the phosphorescent layer.

15. The light-emitting device according to claim 11,
wherein the fluorescent layer is disposed above the first group of blue light-emitting diode elements, and the phosphorescent layer is disposed above the second group of blue light-emitting diode elements.

16. The light-emitting device according to claim 12,
wherein the first group of blue light-emitting diode elements are directly covered by the fluorescent layer, and the second group of blue light-emitting diode elements are directly covered by the phosphorescent layer, and wherein the fluorescent layer includes YAG material and the phosphorescent layer includes at least one phosphorescence selected from green phosphorescence and red phosphorescence.

17. A light-emitting device comprising:
a substrate including a first electrode, a second electrode, and a third electrode;
a first group including a plurality of blue light-emitting diode elements that are electrically connected to the first electrode and the second electrode;
a second group including a plurality of blue light-emitting diode elements that are electrically connected to the second electrode and the third electrode;
a fluorescent layer directly covering or being arranged above the first group of blue light-emitting diode elements to receive light from the first group of blue light-emitting diode elements; and
a phosphorescent layer with an afterglow characteristic, directly covering or being arranged above the second group of blue light-emitting diode elements to receive light from the second group of blue light-emitting diode elements,
the first group of blue light-emitting diode elements is configured to start to be driven at a first level of voltage, and the second group of blue light-emitting diode elements is configured to start to be driven at a second level of voltage that is higher than the first level of voltage and to be lighted together with the first group of blue light-emitting diode elements while the voltage affected by alternate current is applied to the light-emitting device,
wherein the fluorescent layer is configured to emit light that is different in color from light that is configured to be emitted from the phosphorescent layer,
the light-emitting device further comprising a third group including a plurality of blue light-emitting diode elements that are electrically connected to the electrodes; a second phosphorescent layer disposed to receive light from the third group of blue light-emitting diode elements, and the phosphorescent layer disposed to receive light from the second group of blue light-emitting diode elements being defined as a first phosphorescent layer; and the control circuit that is electrically connected to a switching circuit to switch to apply voltage to the blue light-emitting diode elements of the first group during the AC voltage supply from the AC power source being low and to switch to apply voltage to the blue light-emitting diode elements of the first group, the blue light-emitting diode elements of the second group, and the blue light-emitting diode elements of the third group during the AC voltage supply from the AC power source being high around the AC voltage supply peak.

18. The light-emitting device according to claim 17,
wherein the first group of blue light-emitting diode elements are directly covered by the fluorescent layer, and the second group of blue light-emitting diode elements are directly covered by the phosphorescent layer, and wherein the fluorescent layer includes YAG material and the phosphorescent layer includes at least one phosphorescence selected from green phosphorescence and red phosphorescence.

* * * * *